(12) United States Patent
Hine et al.

(10) Patent No.: US 9,981,348 B2
(45) Date of Patent: May 29, 2018

(54) SOLDER ALLOY AND MOUNTED STRUCTURE USING SAME

(71) Applicant: Panasonic Intellectual Property Management Co., Ltd., Osaka (JP)

(72) Inventors: Kiyohiro Hine, Osaka (JP); Akio Furusawa, Osaka (JP); Hidetoshi Kitaura, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days. days.

(21) Appl. No.: 15/267,083

(22) Filed: Sep. 15, 2016

(65) Prior Publication Data

US 2017/0129057 A1 May 11, 2017

(30) Foreign Application Priority Data

Nov. 5, 2015 (JP) .................................. 2015-217850

(51) Int. Cl.
| | |
|---|---|
| *H05K 1/09* | (2006.01) |
| *B23K 35/26* | (2006.01) |
| *C22C 13/00* | (2006.01) |
| *H05K 1/18* | (2006.01) |
| *H05K 3/34* | (2006.01) |

(52) U.S. Cl.
CPC ............ *B23K 35/262* (2013.01); *C22C 13/00* (2013.01); *H05K 1/181* (2013.01); *H05K 3/3457* (2013.01); *H05K 3/3463* (2013.01); *H05K 2201/10022* (2013.01); *H05K 2201/10636* (2013.01); *Y02P 70/611* (2015.11)

(58) Field of Classification Search
CPC ...... H05K 1/181; H05K 3/3457; B23K 35/26; B23K 35/262; C22C 13/00; H01B 7/00

USPC ............ 174/257, 84 R, 126.4; 420/560, 562, 420/577; 148/23, 24, 400, 528
See application file for complete search history.

(56) References Cited

U.S. PATENT DOCUMENTS

| | | | | |
|---|---|---|---|---|
| 5,985,212 A | * | 11/1999 | Hwang ................ | B23K 35/262 148/400 |
| 8,598,464 B2 | * | 12/2013 | Sakatani ............. | B23K 35/262 174/260 |
| 2002/0051728 A1 | * | 5/2002 | Sato ...................... | B22F 1/0048 420/562 |
| 2003/0085253 A1 | * | 5/2003 | Shimizu ................ | B22F 1/0014 228/56.3 |

(Continued)

FOREIGN PATENT DOCUMENTS

| | | |
|---|---|---|
| JP | 8-192291 | 7/1996 |
| JP | 3363393 B | 1/2003 |

(Continued)

*Primary Examiner* — Xiaoliang Chen
(74) *Attorney, Agent, or Firm* — Panasonic IP Management; Kerry S. Culpepper

(57) ABSTRACT

A solder alloy is substantially Ag-free and has desirable neat-resistance fatigue characteristics in a high-temperature environment as high as 150° C., even when used for soldering of electronic components having no leads. The solder alloy contains Sb, In, Cu, and Bi, and Sn accounting for the remainder, and satisfies the following formulae:

$0.5 \leq [Sb] \leq 1.25$ $0.66[Sb]+4.16 \leq [In] \leq 6.0$ $0.5 \leq [Cu] \leq 1.2$ $0.1 \leq [Bi] \leq 0.5,$ wherein [Sb], [In], [Cu], and [Bi] represent the contents of Sb, In, Cu, and Bi, respectively, in mass %.

5 Claims, 1 Drawing Sheet

(56) References Cited

U.S. PATENT DOCUMENTS

| | | | |
|---|---|---|---|
| 2003/0124766 A1* | 7/2003 | Kim | H01L 21/565 438/106 |
| 2004/0131879 A1* | 7/2004 | Wittebrood | B23K 35/0238 428/650 |
| 2005/0126339 A1* | 6/2005 | Shimizu | B22F 1/0014 75/331 |
| 2007/0295528 A1* | 12/2007 | Nishi | C22C 13/00 174/126.4 |
| 2008/0251164 A1* | 10/2008 | Lohwongwatana | C22C 45/00 148/528 |
| 2009/0235968 A1* | 9/2009 | Luo | H01L 35/32 136/205 |
| 2010/0084050 A1* | 4/2010 | Kraemer | B23K 35/262 148/23 |
| 2011/0120769 A1* | 5/2011 | Sakatani | B23K 35/262 174/84 R |
| 2011/0140271 A1* | 6/2011 | Daubenspeck | H01L 23/49816 257/738 |
| 2012/0025383 A1* | 2/2012 | Daubenspeck | H01L 21/76852 257/762 |
| 2013/0199593 A1* | 8/2013 | Higashida | H01L 35/08 136/230 |
| 2013/0327444 A1* | 12/2013 | Sawamura | B23K 35/025 148/24 |
| 2014/0187034 A1* | 7/2014 | Daubenspeck | H01L 23/49816 438/614 |
| 2014/0361070 A1* | 12/2014 | Cho | B23K 35/264 228/249 |
| 2016/0368102 A1* | 12/2016 | Nishimura | B23K 35/26 |

FOREIGN PATENT DOCUMENTS

| | | |
|---|---|---|
| JP | 2013-252548 | 12/2013 |
| JP | 2014-026963 | 2/2014 |

\* cited by examiner

SOLDER ALLOY AND MOUNTED STRUCTURE USING SAME

TECHNICAL FIELD

The technical field relates mainly to a solder alloy used for soldering of electronic components to an electronic circuit board, and also to a mounted structure using such a solder alloy.

BACKGROUND

A Pb-containing solder (for example, Sn-38Pb) has long been used as a solder alloy for soldering. However, recent concerns over lead toxicity have created a trend for Pb-free solder alloys. Sn—Ag-based solders have been widely used as such Pb-free solder alloys, and Sn-3.0Ag-0.5Cu solders, in particular, have become standard in view of solder alloy properties such as melting point, wettability, and heat-resistance fatigue characteristics.

A solder joint needs to have high mechanical characteristics and high heat-resistance fatigue characteristics in a mounted structure in which an electrode portion of an electronic component is joined to an electrode portion on a circuit board with a solder alloy (solder joint), specifically a Pb-free solder alloy, as detailed below.

A solder alloy as a constituent member of the mounted structure has a lower wetting point than the electronic components (specifically, for example, the terminal electrodes of electronic components) or the circuit board. The mechanical characteristics of the solder joint can thus suffer greatly in a high-temperature environment of, for example, about 100° C. or more.

A solder alloy also has a smaller elastic modulus than other constituent members, and is subject to localized strains due to the differences in the linear coefficients of expansion of constituent members involving temperature changes, or localized loads due to vibrations or impact. Particularly, a solder joint may crack when it is under the repeated strains due to the differences in the linear coefficients of expansion of constituent members, and this may lead to disconnection.

A solder alloy used for the mounted structure thus requires high heat-resistance fatigue characteristics against strains that repeatedly occur with temperature changes, and high mechanical characteristics, particularly, high strength and high ductility in a high temperature environment.

There is a movement to reduce the noble metal silver contained in the Sn—Ag-based solder alloy. However, use of silver is still pervasive because low Ag contents can lead to an increased melting point, and low wettability, particularly poor heat-resistance fatigue characteristics at the solder joint.

Under these circumstances, Japanese Patent No. 3363393 discloses a Pb-free solder alloy containing no silver, specifically a Pb-free solder alloy in which 1 to 15 weight % of Bi, and 1 to 15 weight % of In are added to an alloy containing 0.1 to 2.5 weight % of Cu, and the remainder Sn, preferably with at least one selected from the group consisting of Ni, Ge, Pd, Au, Ti, and Fe.

The Pb-free solder alloy of the foregoing related art contains only Cu, Bi, and In as essential components, and is described as improving heat-resistance fatigue characteristics with addition of 0.1 to 2.5 weight % of Cu, lowering the melting point of a Sn—Cu-based solder alloy with addition of 1 to 15 weight % of Bi and 1 to 15 weight % of In. The related art also describes improving mechanical strength with addition of at least one selected from the group consisting of Ni, Ge, Pd, Au, Ti, and Fe. In the Examples section of the foregoing related art, cracking is reduced after 960 to 1,380 cycles in a heat resistance fatigue test conducted at a temperature as high as 125° C. with the Pb-free solder alloy soldering a QFP (Quad Flat Package) having interconnection leads to the land of a printed board.

SUMMARY

While the Pb-free solder alloy of the foregoing related art improves mechanical strength at ordinary temperature, the mechanical strength in a high-temperature environment is not discussed. The ductility in a high-temperature environment is also poor. The heat-resistance fatigue characteristics are desirable because the strain produced by the linear coefficient of expansion difference in response to temperature changes can be absorbed when electronic components having leads are used as in the case of QFP. However, cracking occurs in electronic components having no leads such as in chip resistors and chip capacitors because the strain concentrates on the solder, and cannot be absorbed. Considering use for soldering of electronic components having no leads, the Pb free solder alloy of the foregoing related art cannot be said as having sufficient characteristics.

The heat density of electronic devices has increased with miniaturization of electronic devices, and the solder joint is heated to ever increasing temperatures during the use of electronic devices. Particularly, electronic devices for automobiles require heat-resistance fatigue characteristics as high as 150° C. With the Pb-free solder alloy of the foregoing related art, it is difficult to ensure heat-resistance fatigue characteristics in a high temperature environment above the maximum temperature 125° C. of the related art.

In view of the foregoing problems, as well as other concerns, a substantially Ag-free solder alloy is provided that has desirable heat-resistance fatigue characteristics in a high-temperature environment as high as 150° C. even when used for soldering of electronic components having no leads.

The solder alloy contains Sb, In, Cu, and Bi, and Sn accounting for the remainder, and that satisfies the following formulae:

$$0.5 \leq [Sb] \leq 1.25$$

$$0.66 \times [Sb] + 4.16 \leq [In] \leq 6.0$$

$$0.5 \leq [Cu] \leq 1.2$$

$$0.1 \leq [Bi] \leq 0.5,$$

wherein [Sb], [In], [Cu], and [Bi] represent the contents of Sb, In, Cu, and Bi, respectively, in mass %.

The solder alloy further satisfies the following formula:

$$1.33 \times [Sb] + 3.83 \leq [In] \leq 0.67 \times [Sb] + 4.67.$$

The solder alloy may have an alloy structure including a γ phase and a β-Sn phase forming a solid solution with at least Sb.

A mounted structure of an electronic component on a circuit board is provided, wherein an electrode portion of the electronic component and an electrode portion of the circuit board are joined to each other with the solder alloy.

As used herein, "solder alloy" may have a metal composition that contains a trace amount of unavoidably mixed metal, provided that the composition is of substantially the metals given herein. The solder alloy may have any form, and may be used for soldering, for example, either alone, or with components (for example, a flux) other than metals.

The present disclosure can provide a substantially Ag-free solder alloy of Sn, Sb, In, Cu, and Bi for which predetermined contents are selected except for Sn. The solder alloy can achieve excellent mechanical characteristics (specifically, strength, and ductility), and, in turn, excellent heat-resistance fatigue characteristics in a high-temperature environment as high as 150° C. even when used for soldering of electronic components having no leads.

Because disconnection due to cracks involving reduced ductility can be reduced even for electronic components having no leads such as chip resistors and chip capacitors, a solder joint can be formed that is Ag-free, and having desirable heat-resistance fatigue characteristics.

DESCRIPTION OF EMBODIMENTS

Figure 1:
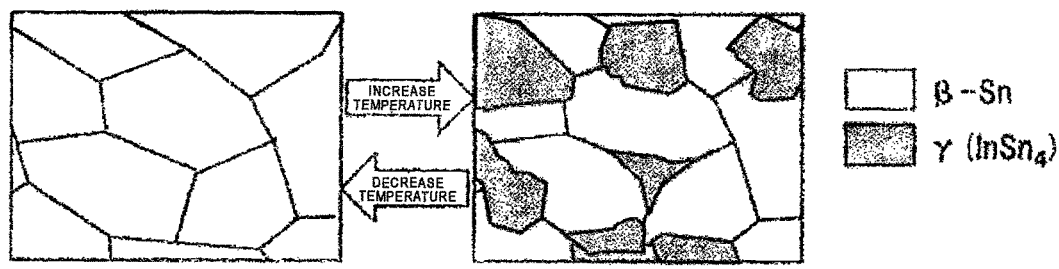
FIG. 1 is a diagram schematically representing a state of the structure of the solder alloy of an embodiment of the present disclosure.

A solder alloy, and a mounted structure using same according to an embodiment of the present disclosure are described below with reference to the accompanying drawings.

In this specification, the brackets [ ] attached to the symbols of the constituent elements of the solder alloy indicate the content (mass %) of each element in the solder alloy.

The numeric value or range preceding the metallic elements other than Sn in the metal composition of the solder alloy described herein is the numeric value or range of the proportion of each element of the metal composition in mass % (=weight %), and indicates that the remainder is Sn, as commonly practiced in the art.

A solder alloy of an embodiment of the present disclosure contains Sb, In, Cu, and Bi, and Sn accounting for the remainder, and satisfies the following formulae:

$$0.5 \leq [Sb] \leq 1.25$$

$$0.66[Sb] + 4.16 \leq [In] \leq 6.0$$

$$0.5 \leq [Cu] \leq 1.2$$

$$0.1 \leq [Bi] \leq 0.5,$$

wherein [Sb], [In], [Cu], and [Bi] represent the contents of Sb, In, Cu, and Bi, respectively, in mass %.

The present inventors conducted research and development regarding mechanical characteristics of solder alloys in a high-temperature environment. This led to the unique finding that the mechanical characteristics in a high-temperature environment (typically, mechanical strength and ductility at 150° C.), for which little was known, greatly improve when a Pb-free solder alloy containing Sn as a primary component contains Sb, In, Cu, and Bi in specific ranges, particularly when In and Sb are contained in ranges that satisfy a specific relationship.

The effectiveness of the element contents in the solder alloy of the embodiment of the present disclosure is described first.

In Content, and Sb Content

The In content, and the Sb content of the solder alloy are described below.

In improves the strength, and the high-temperature ductility of the solder alloy.

A solder alloy containing Sn as a primary component forms an alloy (β-Sn phase) as a solid solution of In in Sn in a low In content range of about 15 mass % or less.

Solid solution describes a phenomenon in which some of the base metals in a crystal lattice are replaced by a solid solution element at an atomic level. Typically, the solid solution element acts to generate a strain in the crystal lattice of the base element with the atom size difference between the base metallic element and the solid solution element, and reduce movement of crystal defects such as translocation under a stress load. While this can improve the metal strength, the ductility under a stress load suffers. The strength improvement of a solder alloy by solid solution improves as the content of the solid solution element increases.

However, when a solid solution of In is formed in a Sn-based solder, a phase transformation from a β-Sn phase to a γ phase ($InSn_4$) of a different structure starts to occur as the temperature becomes about 100° C. or higher when the temperature is gradually increased (see FIG. 1), though the effect varies with the In content. Specifically, a (γ+β-Sn) state occurs in which the two different phases coexist to similar extent. In the two-phase state, the contribution of the slip at the grain boundary becomes greater, and the high-temperature ductility improves.

On the other hand, an excessive transformation from a β-Sn phase to a γ phase occurs when the In content is high. In this case, because the crystal lattice structures of the γ phase and the β-Sn phase have different volumes, the solder alloy undergoes self deformation under repeated thermal cycles. This is problematic as it causes fracture inside the solder joint, or shorting between different solder joints.

Sb raises the transformation temperature in a Sn—In-based alloy.

This is because containing Sb changes the state of the alloy structure. When the Sb content is relatively small, Sb forms a solid solution with Sn in a Sn—In-based alloy, as with the case of In. As the Sb content increases, Sb forms a compound with In (InSb), and precipitates in the alloy structure.

A solid solution of Sb in Sn with In reduces movement of the Sn and In elements in response to temperature changes, and alters the temperature at which transformation of the β-Sn phase and the γ phase occurs.

The mechanical characteristics of a solder alloy improve as the solder alloy strength improves upon formation of a solid solution with Sb, as with the case of the In solid solution. The present inventors also found that a solid solution of Sb further promotes the ductility improvement at high temperature observed when In is contained in a certain range, as will be described later.

As the Sb content increases further, InSn precipitates between crystal structures in a shape that resembles a pin, and reduces deformation. On the other hand, ductility suffers as InSb precipitates, and excess InSb precipitation is unsuited for improving heat-resistance fatigue characteristics.

In the present disclosure, the In content and the Sb content are chosen to satisfy a specific relationship while limiting the Cu content and the Bi content in predetermined ranges. This makes it possible to greatly improve mechanical characteristics in a high-temperature environment (typically, mechanical strength and ductility at 150° C.).

FIG. 1 is a diagram schematically representing a state of the structure of the solder alloy of the present embodiment. In the present embodiment, it can be recognized that the β-Sn phase and the γ phase both form a solid solution with at least Sb. The present disclosure, however, is not limited to this embodiment. For example, it should be noted that the γ phase may occur as the temperature rises to about 100° C. or higher, and is not necessary at lower temperatures, as described above.

Cu Content

Cu is contained to lower the melting point for soldering, and to improve selectivity for the material of a joined member.

The joined member used for soldering is often a material obtained from the base material Cu or Ni after various treatments such as plating, and a preflux treatment.

When the base material of the joined member is nickel, indium is partly incorporated in the interface reaction layer ($Ni_3Sn_4$) upon soldering the joined member with a solder alloy containing In, and a small amount of Cu, if any. This alters the mechanical characteristics of the solder joint upon soldering. When the base material of the joined member is nickel, indium needs to be contained in as large an amount as possible to make up for the amounts that become partly incorporated in the interface reaction layer. However, because a wide range of electronic components are mounted on a single circuit board in actual practice, it is difficult to preadjust the In content when mounting electronic components containing Cu or Ni as a base material.

However, when the solder alloy contains a certain quantity of copper, the copper in the solder alloy forms a $Cu_6Sn_5$-based alloy layer in the interface reaction layer upon soldering. This prevents incorporation of indium, and improves selectivity for the joined member.

In order to develop such an effect, the Cu Content is desirably 0.5 mass % or more. The lower limit of Cu content is 0.5 mass % accordingly.

The melting point increases when copper is contained in excess. For this reason, the Cu content is desirably 1.2 mass % or less.

In the solder alloy of the embodiment of the present disclosure, the Cu content is 0.5 mass % to 1.2 mass %.

Bi Content

Bi is contained to improve the mechanical strength of the solder material, and to lower the melting point. When the Bi content is relatively small, bismuth forms a solid solution with β-Sn in the solder alloy. On the other hand, Bi exists in the form of a precipitate of bismuth, or a precipitate of a bismuth compound, when the Bi content is high.

In order to exhibit the mechanical strength improving effect, bismuth needs to be contained in an amount of 0.1 mass % or more. The preferred Bi content is therefore 0.1 mass % or more.

While increasing the Bi content improves the mechanical strength, it also lowers the ductility. In order to reduce a reduction of ductility, the Bi content is preferably 0.5 mass % or less.

In the solder alloy of the embodiment of the present disclosure, the Bi content is 0.1 mass % to 0.5 mass %.

In order to ascertain the effects of the present disclosure, solder alloys (samples) of predetermined compositions were produced, and evaluated.

First, in order to ascertain the effect of Sb content of a Sn—In-based solder alloy (also containing Bi and Cu in the foregoing ranges) on strength and ductility in a high-temperature environment, solder alloys of the metal compositions shown in Table 1 were produced and evaluated. A common Sn—Ag-based solder alloy of the composition Sn-3.0Ag-0.5Cu was also produced as Comparative Example 1-4, as shown in Table 1 along with the results of the measurements of mechanical characteristics in a high-temperature environment. (The same is the case for the other tables.)

TABLE 1

| | Metal composition (mass %) | | | | | | 150° C. | | |
|---|---|---|---|---|---|---|---|---|---|
| | Sn | Ag | Bi | In | Cu | Sb | Transformation temperature (° C.) | Tensile strength (MPa) | Elongation (%) | Evaluation |
| Ex. 1-1 | bal. | — | 0.5 | 5.0 | 0.8 | 0.50 | 169 | 14.6 | 70 | Excellent |
| Ex. 1-2 | bal. | — | 0.5 | 5.0 | 0.8 | 0.75 | 174 | 15.0 | 58 | Excellent |
| Ex. 1-3 | bal. | — | 0.5 | 5.0 | 0.8 | 1.00 | 179 | 15.1 | 37 | Good |
| Ex. 1-4 | bal. | — | 0.5 | 5.0 | 0.8 | 1.25 | 180 | 15.1 | 27 | Good |
| Com. Ex. 1-1 | bal. | — | 0.5 | 5.0 | 0.8 | — | 159 | 13.9 | 44 | Poor |
| Com. Ex. 1-2 | bal. | — | 0.5 | 5.0 | 0.8 | 0.25 | 164 | 14.3 | 53 | Poor |
| Com. Ex. 1-3 | bal. | — | 0.5 | 5.0 | 0.8 | 1.50 | 181 | 15.3 | 21 | Poor |
| Com. Ex. 1-4 | bal. | 3.0 | — | — | 0.5 | — | — | 14.4 | 24 | — |

In Table 1 and the other tables, "bal." means the remainder, and the symbol "-" indicates that the sample was essentially unmeasurable, or the evaluation was indeterminable.

The samples evaluated in the present embodiment were produced as follows.

Tin and other constituent elements were weighed so that these were contained in the solder alloy in the required contents in a total of 100 g.

The weighed portion of tin was introduced into a ceramic crucible, and the crucible was installed in an electric jacket heater after bringing the temperature to 500° C. and creating a nitrogen atmosphere.

After checking that the tin had melted, the other elements were introduced in order of increasing melting points, and the mixture was stirred for 3 min every time the element was introduced.

The crucible was then removed from the electric jacket heater, and cooled by being immersed in a container filled with 25° C. water. This completed the solder alloy.

Transformation Temperature

In order to evaluate the transformation temperature at which the phase transformation between β-Sn and γ rapidly takes place, 10 mg of the solder alloy produced above was taken out, and subjected to differential scanning calorimetry (DSC). The measurement was made in a 25° C. to 250° C. temperature range with a rate of temperature increase of 10° C./min.

Figure 2:
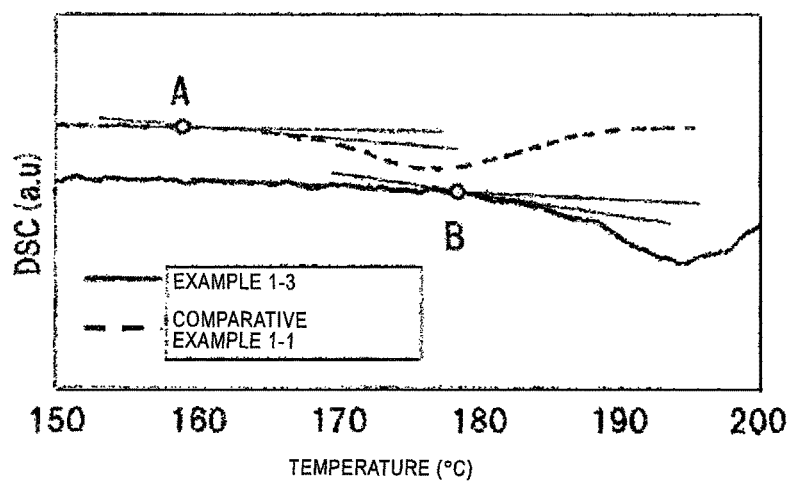
FIG. 2 is a graph shoving the results of the differential scanning calorimetry of the solder alloys described in the embodiment of the present disclosure. Point A and point B represent transformation temperatures.

FIG. 2 represents the results of the measurements of the solder alloys of Example 1-3 and Comparative Example 1-1. The transformation temperature can be measured by reading temperatures at point A and point B representing the point of inflection (transformation point) of the differential scanning calorimetry curve. As can be seen in the figure, in contrast to the Sb-free solder alloy of Comparative Example 1-1 in which the transformation temperature occurred at 159° C. at point A, the solder alloy of Example 1-3 containing 1.0 mass % of Sb had a higher transformation temperature at 179° C. at point B.

Table 1 shows the transformation temperatures of other Examples and Comparative Examples measured in the same manner. No clear transformation temperature was observed in Comparative Example 1-4.

Mechanical Characteristics in High-Temperature Environment (Tensile Strength and Elongation at 150° C.)

For evaluation of mechanical characteristics in a high-temperature environment, the strength and ductility (tensile strength and elongation at 150° C.) of the solder alloy were evaluated in a tensile test performed in a 150° C. environment using a tensile test piece. For fabrication of a tensile test piece, the solder alloy produced above was introduced into a crucible, and melted by being heated to 250° C. with an electric jacket heater. The molten alloy was then poured into a graphite template that had been shaped into the form of the tensile test piece. The tensile test piece had a round rod shape with a constriction, and measured 3 mm in diameter, and 15 mm in length. From the results of the tensile test at 150° C., the stroke strain and the tensile stress of a tensile tester were measured, and the maximum values of the measured values were obtained as the elongation (breaking elongation) and the tensile strength. The results are presented in Table 1.

Evaluation

The effects of the present disclosure were decided to be present when the transformation temperature was 150° C. or more, and the mechanical characteristics, specifically the tensile strength as a measure of strength, and the elongation as a measure of ductility were both desirable compared to Comparative Example 1-4 (Good), and, in particular, when the elongation at 150° C. showed a two-fold or greater increase over Comparative Example 1-4 (Excellent). The solder alloys were determined as "Poor" when the transformation temperature was less than 150° C., or when the tensile strength and the elongation values were less than the values obtained in Comparative Example 1-4.

The effects of the present disclosure were exhibited in Examples 1-1 to 1-4. Specifically, the transformation temperature was 150° C. or more, and the strength (tensile strength) and the ductility (elongation) improved when the solder alloy contained Sb in an amount of 0.50 to 1.25 mass %. On the other hand, the solder alloys of Comparative Examples 1-1 and 1-2 with the Sb content of 0.25 mass % or less were determined as "Poor" because the lack of Ag resulted in lower strength than in Comparative Example 1-4, though the ductility (elongation) at 150° C. was desirable. When the Sb content was 1.5 mass % as in Comparative Example 1-3, the InSb generation became prominent, and the high-temperature ductility deteriorated. The solder alloy was therefore "Poor".

As can be seen from Examples and Comparative Examples, the transformation temperature is 150° C. or more when the In content is 5.0 mass %.

As can be seen from the results shown in Table 1, the effects of the present disclosure are exhibited when the Sb content ranges from 0.5 mass % to 1.25 mass %.

The effect of In content was ascertained by producing and evaluating solder alloys of the metal compositions shown in Table 2. The solder alloys were produced and evaluated in the same manner described above, and contained Sb in the minimum amount of 0.50 mass %.

TABLE 2

| | Metal composition (mass %) | | | | | | Transformation | 150° C. | | |
| | | | | | | | | Tensile | | |
| | Sn | Ag | Bi | In | Cu | Sb | temperature (° C.) | strength (MPa) | Elongation (%) | Evaluation |
| --- | --- | --- | --- | --- | --- | --- | --- | --- | --- | --- |
| Ex. 2-1 | bal. | — | 0.5 | 4.5 | 0.8 | 0.50 | 179 | 14.4 | 56 | Excellent |
| Ex. 2-2 | bal. | — | 0.5 | 5.0 | 0.8 | 0.50 | 169 | 14.6 | 70 | Excellent |
| Ex. 2-3 | bal. | — | 0.5 | 5.5 | 0.8 | 0.50 | 160 | 14.7 | 44 | Good |
| Ex. 2-4 | bal. | — | 0.5 | 6.0 | 0.8 | 0.50 | 151 | 14.7 | 35 | Good |
| Com. Ex. 2-1 | bal. | — | 0.5 | 4.0 | 0.8 | 0.50 | 188 | 14.1 | 43 | Poor |
| Com. Ex. 2-2 | bal. | — | 0.5 | 6.5 | 0.8 | 0.50 | 141 | 14.9 | 28 | Poor |
| Com. Ex. 1-4 | bal. | 3.0 | — | — | 0.5 | — | — | 14.4 | 24 | — |

As shown in Table 2, the transformation temperature was 150° C. or more, and the tensile strength and the elongation at 150° C. were more desirable than Comparative Example 1-4 in Examples 2-1 to 2-4 in which In was contained in an amount of 4.5 mass % to 6.0 mass % with 0.5 mass % of Sb.

Comparative Example 2-1 with the small In content was determined as "Poor" because of the insufficient tensile strength, though the elongation improved. The transformation temperature decreased with increase of the In content. The tensile strength and the elongation at 150° C. were both desirable in Comparative Example 2-2 in which the In content was 6.5 mass %. However, Comparative Example 2-2 was "Poor" because the transformation temperature was less than 150° C.

Solder alloys containing Sb in the upper limit content of 1.25 mass % were produced and evaluated, as shown in Table 3. The solder alloys were produced and evaluated in the same manner described above.

TABLE 3

| | Metal composition (mass %) | | | | | 150° C. | | | |
|---|---|---|---|---|---|---|---|---|---|
| | | | | | | Transformation | Tensile | | |
| | Sn | Ag | Bi | In | Cu | Sb | temperature (° C.) | strength (MPa) | Elongation (%) | Evaluation |
| Ex. 3-1 | bal. | — | 0.5 | 5.0 | 0.8 | 1.25 | 180 | 15.1 | 27 | Good |
| Ex. 3-2 | bal. | — | 0.5 | 5.5 | 0.8 | 1.25 | 171 | 15.2 | 51 | Excellent |
| Ex. 3-3 | bal. | — | 0.5 | 6.0 | 0.8 | 1.25 | 162 | 15.3 | 36 | Good |
| Com. Ex. 3-1 | bal. | — | 0.5 | 4.0 | 0.8 | 1.25 | — | 14.5 | 20 | Poor |
| Com. Ex. 3-2 | bal. | — | 0.5 | 4.5 | 0.8 | 1.25 | — | 14.9 | 23 | Poor |
| Com. Ex. 3-3 | bal. | — | 0.5 | 6.5 | 0.8 | 1.25 | 152 | 15.5 | 21 | Poor |
| Com. Ex. 1-4 | bal. | 3.0 | — | — | 0.5 | — | — | 14.4 | 24 | — |

As shown in Table 3, the transformation temperature increased with decrease of the In content, and no clear transformation temperature was observed in Comparative Examples 3-1 and 3-2 in which the In content was 4.5 mass % or less. By focusing on the mechanical characteristics including tensile strength and elongation, the solder alloys of Comparative Examples 3-1 and 3-2 in which the In content was 4.0 mass % and 4.5 mass %, respectively, were "Poor" because the elongation decreased with decrease of the In content, and the elongation at 150° C. was smaller than In Comparative Example 1-4. The elongation decreased as the In content increased, starting from Example 3-2 in which the In content was 5.5 mass %. In Comparative Example 3-2 with the In content of 6.5 mass %, the elongation at 150° C. was smaller than in Comparative Example 1-4. This made the solder alloy of Comparative Example 3-2 "Poor".

From the results shown in Tables 2 and 3, the In content range that exhibits the effects of the present disclosure (specifically, the In content in relation to the Sb content) is as follows.

With the minimum Sb content of 0.5 mass %, the effects of the present disclosure were observed when the In content was 4.5 mass % to 6.0 mass %. With the maximum Sb content of 1.25 mass %, the effects of the present disclosure were observed when the In content was 5.0 mass % to 6.0 mass %. The minimum value of In content increases with increase of the Sb content. In a linear approximation of the relationship between the minimum In content value and Sb content, the expressions in the following formula 1 need to be satisfied (here and below, a and b represent the slope and the intercept of a straight line in an orthogonal coordinate system taking the Sb content [Sb] as the horizontal axis, and the In content [In] as the vertical axis).

$$4.5 = 0.5a + b$$

$$5.0 = 1.25a + b \quad \text{Formula 1}$$

From Tables 2 and 3, and by solving the expressions in formula 1, the In content and the Sb content can have a relationship that satisfies the following formula A.

$$0.66[Sb] + 4.16 \leq [In] \leq 6.0 \quad \text{A}$$

Note here that the Sb content satisfies the following expression for the reasons described above.

$$0.5 \leq [Sb] \leq 1.25$$

From Examples 2-1, 2-2, and 3-2 in which the effects of the present disclosure were high, it is thought that the following conditions are preferred for enhancing the effects of the present disclosure.

With the Sb content of 0.5 mass %, the effects of present disclosure increase when In is contained in the minimum amount of 4.5 mass %. The minimum In content is 5.5 mass % when the Sb content is 1.25 mass %. The minimum In content value and Sb content thus need to satisfy the following expressions in formula 2.

$$4.5 = 0.5a + b$$

$$5.5 = 1.25a + b \quad \text{Formula 2}$$

From Examples 2-1, 2-2, and 3-2, and by solving the expressions in formula 2, the minimum In content value and the Sb content can have a relationship that satisfies the following formula B1.

$$1.33[Sb] + 3.83 \leq [In] \quad \text{B1}$$

With the Sb content of 0.5 mass %, the effects of the present disclosure increase when In is contained in the maximum amount of 5.0 mass %. The maximum In content is 5.5 mass % when the Sb content is 1.25 mass %. The maximum In content value and the Sb content thus need to satisfy the expressions in the following formula 3.

$$5.0 = 0.5a + b$$

$$5.5 = 1.25a + b \quad \text{Formula 3}$$

From Examples 2-1, 2-2, and 3-2, and by solving the expressions in formula 3, the maximum In content value and the Sb content can have a relationship that satisfies the following formula B2.

$$[In] \leq 0.67[Sb] + 4.67 \quad \text{B2}$$

From formulae 2 and 3, the In content and the Sb content can have a relationship that satisfies the following formula B.

$$1.33[Sb] + 3.83 \leq [In] \leq 0.67[Sb] + 4.67$$

Note here that the Sb content satisfies the following expression for the reasons described above.

$$0.5 \leq [Sb] \leq 1.25$$

Solder alloys of Examples and Comparative Examples with the metal compositions shown in Table 4 were produced with the content of each element determined above, and the heat-resistance fatigue characteristics of each solder alloy were evaluated. The solder alloys were produced in the same manner described above. Solder alloys containing Ni, Ge, Pd, and Au were also produced as Conventional Examples 1 to 4, and evaluated for heat-resistance fatigue characteristics in the same manner, as shown in Table 4.

Figure 3:
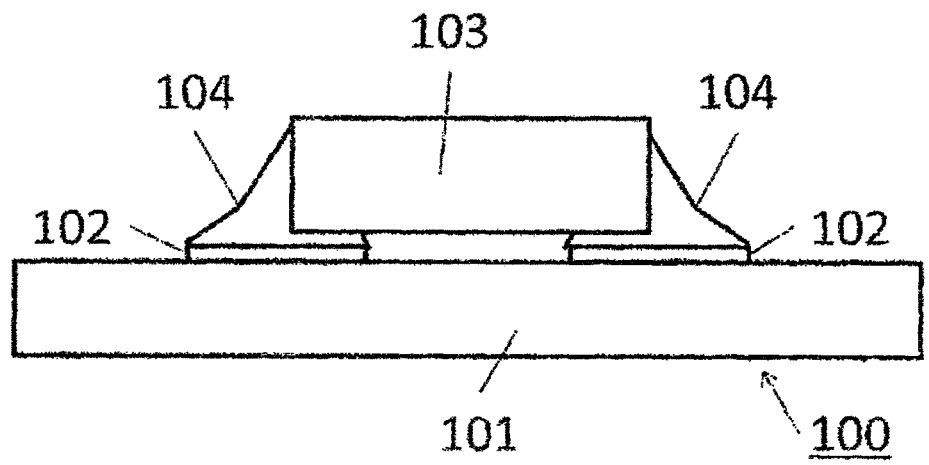
FIG. 3 is a schematic cross sectional view of a mounted structure obtained by using the solder alloy of the embodiment of the present disclosure.

For the evaluation of heat-resistance fatigue characteristics, a mounted structure of an electronic component on a circuit board was fabricated in which an electrode portion of the electronic component and an electrode portion of the circuit board were joined to each other with the solder alloy of the embodiment of the present disclosure. Specifically, as illustrated in FIG. 3, a mounted structure 100 of an embodiment of the present disclosure has a structure in which a solder joint 104 formed of the solder alloy of the embodiment of the present disclosure joins the electrode portion (not illustrated) of a chip resistor 103 to the circuit board electrode (for example, a land) 102 formed as an electrode portion on a surface of a circuit board 101.

The heat-resistance fatigue characteristics were evaluated as follows.

First, the solder alloy produced was processed into a solder powder having a particle size of several tens of micrometers, and the solder powder and a flux (configured from an organic solvent, rosin, a reducing component, and a thixotropic agent) were weighed in a 90:10 weight ratio, and kneaded to produce a solder paste. The solder paste was then printed to the circuit board electrode 102 on the circuit board 101 using a metal mask having a thickness of 150 μm. Thereafter, the chip resistor 103 was mounted on the printed solder paste, and heated to reflow at a temperature as high as 240° C. to form a solder joint 104, and join the circuit board electrode 101 and the chip resistor 103 to each other. This completed the mounted structure. Cu and Ni were used as the base materials of the circuit board electrode 102 of the circuit board 101.

The mounted structure so fabricated was tested by a −40° C./150° C. temperature cycle test, in which the mounted structure was visually inspected for any deformation of the solder joint 104 after 2,000 cycles. The electrical connection was evaluated when the visual inspection did not find deformation, and determined as having an electrical failure when the resistance value change was 10% or greater relative to the initial value, and having no electrical failure when there was no change, or when the change was less than 10%. In Table 4, the symbol "-" under the heading "Electrical failure" means that the evaluation was not performed.

As shown in Table 4, the solder joint did not undergo self deformation, and there was no electrical failure such as shorting or disconnection in Examples 4-1 to 4-10 in which the solder alloys had the composition ranges determined above.

On the other hand, the solder joint had an electrical failure in Comparative Examples 4-1 to 4-3, 4-5, and 4-6 of different In and Sb contents. The solder joint underwent self deformation in Comparative Example 4-4 in which the Sb content was relatively small, and the In content was excessively high, and in Conventional Example 4 in which the solder alloy did not contain Sb, and had an excessively high In content.

In Comparative Example 4-7 that did not contain Cu, disconnection occurred when the base material of the circuit board electrode was nickel.

An electrical failure occurred in Comparative Example 4-8 that had a Cu content of 1.5 mass %, in Comparative Example 4-9 that did not contain Bi, in Comparative Example 4-10 that had a Bi content of 1.0 mass %, in Comparative Example 1-4 in which a common solder alloy containing Ag was used, and in Conventional Examples 1 to 3.

It was confirmed from the evaluation results shown in Tables 1 to 4 that the effects of the present disclosure are exhibited by the solder alloy that contains Sb, In, Cu, and Bi, and Sn accounting for the remainder, and that satisfies the following formulae:

$$0.5 \leq [Sb] \leq 1.25$$

$$0.66[Sb]+4.16 \leq [In] \leq 6.0$$

$$0.5 \leq [Cu] \leq 1.2$$

$$0.1 \leq [Bi] \leq 0.5,$$

wherein [Sb], [In], [Cu], and [Bi] represent the contents of Sb, In, Cu, and Bi, respectively, in mass %.

TABLE 4

| | Metal composition (mass %) | | | | | | | | Electrical failure Base material of circuit board electrode | |
|---|---|---|---|---|---|---|---|---|---|---|
| | Sn | Ag | Bi | In | Cu | Sb | Other | Self deformation | Cu | Ni |
| Ex. 4-1 | bal. | — | 0.5 | 4.5 | 0.8 | 0.50 | | Absent | Absent | Absent |
| Ex. 4-2 | bal. | — | 0.5 | 5.0 | 0.8 | 0.50 | | Absent | Absent | Absent |
| Ex. 4-3 | bal. | — | 0.5 | 5.0 | 0.8 | 1.25 | | Absent | Absent | Absent |
| Ex. 4-4 | bal. | — | 0.5 | 5.5 | 0.8 | 0.50 | | Absent | Absent | Absent |
| Ex. 4-5 | bal. | — | 0.5 | 5.5 | 0.8 | 1.25 | | Absent | Absent | Absent |
| Ex. 4-6 | bal. | — | 0.5 | 6.0 | 0.8 | 0.50 | | Absent | Absent | Absent |
| Ex. 4-7 | bal. | — | 0.5 | 6.0 | 0.8 | 1.25 | | Absent | Absent | Absent |
| Ex. 4-8 | bal. | — | 0.5 | 5.0 | 0.5 | 0.50 | | Absent | Absent | Absent |
| Ex. 4-9 | bal. | — | 0.5 | 5.0 | 1.2 | 0.50 | | Absent | Absent | Absent |
| Ex. 4-10 | bal. | — | 0.1 | 5.0 | 0.8 | 0.50 | | Absent | Absent | Absent |
| Com. Ex. 4-1 | bal. | — | 0.5 | 5.0 | 0.8 | — | | Absent | Present | Present |
| Com. Ex. 4-2 | bal. | — | 0.5 | 5.0 | 0.8 | 1.50 | | Absent | Present | Present |
| Com. Ex. 4-3 | bal. | — | 0.5 | 4.0 | 0.8 | 0.50 | | Absent | Present | Present |
| Com. Ex. 4-4 | bal. | — | 0.5 | 6.5 | 0.8 | 0.50 | | Deformed | — | — |
| Com. Ex. 4-5 | bal. | — | 0.5 | 4.5 | 0.8 | 1.25 | | Absent | Present | Present |
| Com. Ex. 4-6 | bal. | — | 0.5 | 6.5 | 0.8 | 1.25 | | Absent | Present | Present |
| Com. Ex. 4-7 | bal. | — | 0.5 | 5.0 | — | 0.50 | | Absent | Absent | Present |
| Com. Ex. 4-8 | bal. | — | 0.5 | 5.0 | 1.5 | 0.50 | | Absent | Present | Present |
| Com. Ex. 4-9 | bal. | — | — | 5.0 | 0.8 | 0.50 | | Absent | Present | Present |
| Com. Ex. 4-10 | bal. | — | 1.0 | 5.0 | 0.8 | 0.50 | | Absent | Present | Present |
| Com. Ex. 1-4 | bal. | 3.0 | — | — | 0.5 | — | | Absent | Present | Present |
| Conventional Ex. 1 | bal. | — | 5.0 | — | 1.0 | — | Ni 0.1 | Absent | Present | Present |
| Conventional Ex. 2 | bal. | — | 5.0 | 2.5 | 1.0 | — | Ge 0.1 | Absent | Present | Present |
| Conventional Ex. 3 | bal. | — | 5.0 | 5.0 | 1.0 | — | Pd 0.1 | Absent | Present | Present |
| Conventional Ex. 4 | bal. | — | 5.0 | 7.5 | 1.0 | — | Au 0.1 | Deformed | — | — |

Preferably, the solder alloy of the embodiment of the present disclosure contains Sb, In, Cu, and Bi, and Sn accounting for the remainder, and satisfies the following formulae:

$$0.5 \leq [Sb] \leq 1.25$$

$$1.33[Sb]+3.83 \leq [In] \leq 0.67[Sb]+4.67$$

$$0.5 \leq [Cu] \leq 1.2$$

$$0.1 \leq [Bi] \leq 0.5,$$

wherein [Sb], [In], [Cu], and [Bi] represent the contents of Sb, In, Cu, and Bi, respectively, in mass %.

The solder alloy of the embodiment of the present disclosure may be configured to have an alloy structure including a γ phase and a β-Sn phase forming a solid solution with at least Sb.

As can foe understood from the above, the solder alloy of the embodiment of the present disclosure can form a solder joint containing substantially no silver, and having desirable heat-resistance fatigue characteristics in a high-temperature environment as high as 150° C., even when used for soldering of electronic components that do not have leads.

The mounted structure of the embodiment of the present disclosure is a structure in which an electrode portion of an electronic component and an electrode portion of a circuit board are joined to each other with the solder alloy above. The mounted structure can thus have a joint having desirable heat-resistance fatigue characteristics even in an environment where the temperature reaches as high as 150° C.

Any electronic components and any circuit boards may be used. The electronic component and the circuit board may have electrode portions made of any suitable conductive material, and these may contain Cu and/or Ni, as described above in conjunction with the joined member. The electrode portion of the electronic component may or may not have leads. In either case (including when the electronic component does not have leads), it is possible to provide a mounted structure having a joint that has desirable heat-resistance fatigue characteristics in a high-temperature environment as high as 150° C. The solder alloy may have any form, and may be used for soldering either alone (for example, in the form of a powder, a wire solder, a molten liquid, or a preform solder), or with other components such as a flux (for example, in the form of a solder paste, or a solder containing tar). Soldering conditions may be appropriately selected.

INDUSTRIAL APPLICABILITY

The solder alloy, and the mounted structure of the embodiment of the present disclosure can achieve a solder joint containing substantially no silver, and having desirable mechanical characteristics (specifically, strength and ductility) even in a high-temperature environment as high as 150° C. For example, the present disclosure is useful for mounted structures of electrical components in automobiles, which require ensuring electrical conduction over a long term in a high-temperature environment such as in the engine room.

What is claimed is:

1. A solder alloy comprising Sb, In, Cu, and Bi, and a balance including only Sn, and satisfying the following formulae:

$$0.5 \leq [Sb] \leq 1.25$$

$$0.66[Sb]+4.16 \leq [In] \leq 6.0$$

$$0.5 \leq [Cu] \leq 1.2$$

$$0.1 \leq [Bi] \leq 0.5,$$

wherein [Sb], [In], [Cu], and [Bi] represent the contents of Sb, In, Cu, and Bi, respectively, in mass %.

2. The solder alloy according to claim 1, which further satisfies the following formula:

$$1.33[Sb]+3.83 \leq [In] \leq 0.67[Sb]+4.67.$$

3. The solder alloy according to claim 2, which has an alloy structure including a γ phase and a β-Sn phase forming a solid solution with at least Sb.

4. A mounted structure of an electronic component on a circuit board, wherein an electrode portion of the electronic component and an electrode portion of the circuit board are joined to each other with the solder alloy of claim 1.

5. The solder alloy according to claim 1, which has an alloy structure including a γ phase and a β-Sn phase forming a solid solution with at least Sb.

* * * * *